United States Patent
Tombs et al.

(10) Patent No.: US 7,650,851 B2
(45) Date of Patent: Jan. 26, 2010

(54) NOZZLE FOR SOLDERING APPARATUS

(75) Inventors: Michael Tombs, Leigh on Sea (GB); Charles Kent, Benfleet (GB)

(73) Assignee: Pillarhouse International Limited, Essex (GB)

( * ) Notice: Subject to any disclaimer, the term of this patent is extended or adjusted under 35 U.S.C. 154(b) by 796 days.

(21) Appl. No.: 10/044,798

(22) Filed: Jan. 10, 2002

(65) Prior Publication Data
US 2002/0110636 A1    Aug. 15, 2002

(30) Foreign Application Priority Data
Jan. 10, 2001    (GB) .................. 0100626.1

(51) Int. Cl.
B05C 3/00    (2006.01)
(52) U.S. Cl. ...................... 118/423; 118/429
(58) Field of Classification Search .................. 228/36, 228/37, 40, 43, 260, 259, 261; 118/429, 118/425, 423
See application file for complete search history.

(56) References Cited

U.S. PATENT DOCUMENTS

| 2,770,875 | A | * | 11/1956 | Zimmerman |
| 3,056,370 | A | * | 10/1962 | Barnes et al. ................. 228/37 |
| 3,151,592 | A | * | 10/1964 | Wegener |
| 3,196,829 | A | * | 7/1965 | Elliott et al. ................. 118/300 |
| 3,303,983 | A | | 2/1967 | Patrick et al. |
| 3,565,319 | A | * | 2/1971 | Eschenbrucher ............. 228/37 |
| 4,527,731 | A | * | 7/1985 | Kent et al. .............. 228/180.21 |
| 4,545,520 | A | * | 10/1985 | Kent |
| 4,684,056 | A | * | 8/1987 | Deambrosio |
| 4,739,919 | A | | 4/1988 | Van Den Brekel et al. |
| 4,981,249 | A | | 1/1991 | Kawashima et al. |
| 5,203,489 | A | * | 4/1993 | Gileta et al. ................. 228/219 |
| 5,242,100 | A | | 9/1993 | Weeks |
| 5,604,333 | A | | 2/1997 | Kennish et al. |
| 5,611,480 | A | | 3/1997 | Ciniglio et al. |
| 5,679,929 | A | | 10/1997 | Greenfield et al. |

FOREIGN PATENT DOCUMENTS

| DE | 19506874 |   | 4/1996 |
| EP | 0147000 |   | 7/1985 |
| EP | 0860229 |   | 8/1998 |
| GB | 2360237 |   | 9/2001 |
| JP | 09323165 |   | 12/1996 |
| JP | 09107181 |   | 4/1997 |
| JP | 10-70360 | * | 3/1998 |
| JP | 10070360 |   | 3/1998 |

* cited by examiner

*Primary Examiner*—Brenda A Lamb
(74) *Attorney, Agent, or Firm*—Gottlieb, Rackman & Reisman, P.C.

(57) ABSTRACT

In a dip soldering process, solder is pumped through a nozzle outlet. Leads of a component on a circuit board are dipped into the surface of the flowing solder to solder the leads to a track on the underside of the circuit board. To prevent solder bridging between the leads, a plate is provided below the solder surface, and passes between the leads. When withdrawing the leads from the solder, the solder surface is dropped to the level of the plate, so that excess solder is drawn away from the leads, preventing solder bridging between the leads. Member may be movable to rise through the solder surface as the circuit board is raised away from the surface.

7 Claims, 5 Drawing Sheets

NOZZLE FOR SOLDERING APPARATUS

The present invention relates to soldering apparatus, and more particularly to a nozzle for use in a dip soldering process Such apparatus is described in EP-A-212 911, EP-A-481 710 and EP-A-564 096 for example.

Typically, solder is pumped from a bath upwards through a nozzle, overflowing the nozzle outlet and returning to the bath. A component or circuit board to be soldered is lowered to dip the leads into the surface of solder at the nozzle outlet. Different sizes and shapes of nozzle are provided to suit the particular component or circuit board layout.

When dip soldering a component or circuit board having several closely spaced leads, there is a danger of solder bridging between adjacent leads. This has long been a problem in the art. In U.S. Pat. No. 5,611,480 the problem of solder bridging is overcome by rotating the circuit board as the leads, on the underside of the board, are withdrawn from the surface of the solder.

Rotation of the board or component requires complex apparatus for holding the board or component. The system described in U.S. Pat. No. 5,611,480 only rotates the board in one plane. EP-A-860 229 describes a system in which the board can be rotated about different axes, to suit the alignment of the leads being soldered, but a more complex apparatus and control system is required.

With some circuit board arrangements there is not sufficient clearance to rotate the board as it leaves the solder surface.

Another approach is to temporarily reduce or stop the flow of solder through the nozzle, so that the solder surface falls away from the circuit board. This does not require rotation of the board, but it is not particularly successful in avoiding solder bridging.

One aspect of the invention provides a dip soldering method and apparatus in which, during the dipping operation, a plate or other member which is wetted by the solder is positioned between the leads which are being soldered. The plate may be elongate and extend between two rows of leads.

To ensure that sufficient solder is provided to the joints being soldered, the board is usually brought down on to the solder surface or close thereto. Thus, the plate will generally lie just below the solder surface for the initial dipping operation.

The solder surface itself may then be lowered below the upper edge of the plate. This draws the solder away from the joints, reducing the likelihood of solder bridging. However in another method and apparatus, the plate or the like may be raised with the board as the board is lifted away from the solder surface, serving to break through the solder surface and so draw solder down towards the plate.

We have found that with appropriate positioning of the wetted plate and control of the height of the solder surface, we can virtually eliminate the risk of solder bridging.

The shape and positioning of the plate or other wetted member can be tailored to suit the components being soldered. Typically, a soldering machine is set up as part of a production line to solder a run of identical products, and nozzles, for delivering the solder to the underside of the circuit board for example, will be designed to fit around the leads being solder. Where there are two closely spaced rows of leads, the wetted member preferably extends between the rows. It will serve to prevent bridging between the rows and also between adjacent leads in a row. However, a wetted member could be positioned to each outer side of the array. In this latter case, the wetted member could be formed by the nozzle walls themselves.

It is well known in the art that some materials, such as iron, are readily wetted by solder whereas others, such as steel, are not. Even through an iron surface is inherently wetted by solder it is still desirable or necessary to achieve a tinning of the surface to ensure proper wetting of the surface during use. Over time, the surface or member may need re-tinning. Also it may be gradually eroded or eaten away by the constant flow of solder past the surface.

The invention will be further described by way of example, with reference to the accompanying drawings, in which FIG. 1 illustrates schematically a dip soldering apparatus and process of the prior art.

FIGS. 4a to 4c illustrate modifications of the embodiment of FIG. 2, as partial views on line IV-IV of FIG. 3a;

Figure 1:
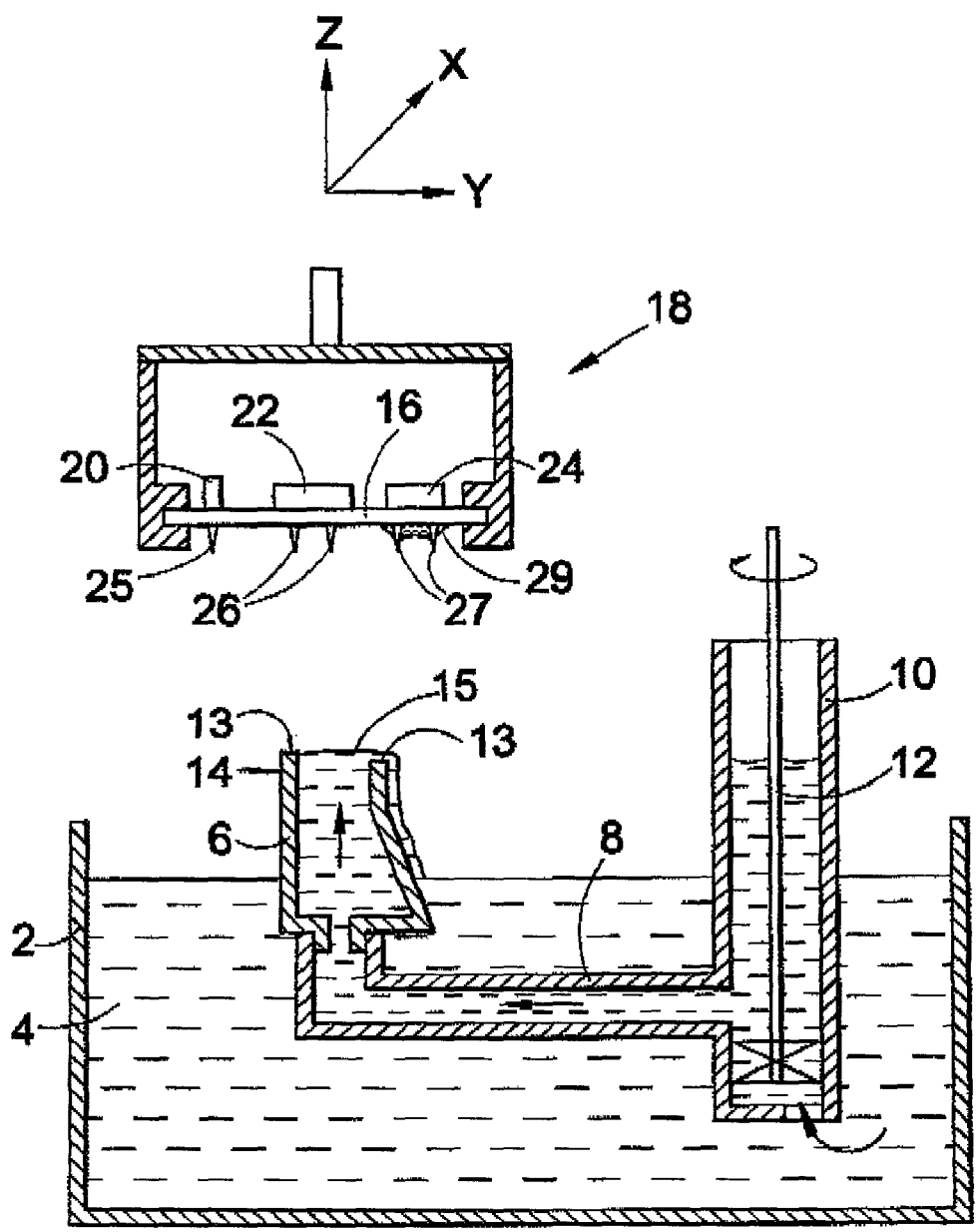

In the apparatus of FIG. 1, a bath 2 contains molten solder 4, which is heated by a heater, not shown. The bath may be covered and/or shrouded in an inert atmosphere such as nitrogen to reduce the formation of dross (oxidised solder). A nozzle 6 is supported on a tubular arm 8 which extends from an impeller housing 10. An impeller 12 is rotated by an electric motor, not shown, to pump solder 4 through arm 8 into nozzle 6. The speed of impeller 12 is adjusted so that solder overflows an upper edge 13 defining an outlet 14 of nozzle 6. This ensures that a fresh solder surface 15 is continuously provided at the nozzle outlet 14.

A printed circuit board 16 is held by a component holder 18 which translates the board 16 in the horizontal plane X, Y and also lowers the board in the vertical direction Z.

Circuit board 16 has components 20, 22, 24 having leads 25, 26, 27 which extend through the board and are to be soldered to printed circuit tracks (not shown) on the underside 28 of the board 16. To perform the soldering operation, the board 16 is, optionally, first passed through a fluxing station where flux is sprayed onto the areas to be soldered. The board is then positioned over the nozzle 6 and lowered, in the Z direction, to dip leads 26 into the solder surface 15 at the nozzle outlet 14. Typically the board 16 will be lowered until it just presses on the solder surface 15. This will help ensure that solder passes into any through holes in the board and is supplied to the junction between the leads 26 and the printed circuit tracks.

After a predetermined period of time, which ensures that the leads 26 and the adjacent track regions reach a sufficient temperature to retain solder, the board 16 is raised and/or solder surface 15 is lowered. Excess solder will be drawn away from the underside 28 of the board 16 by surface tension. The speed of impeller 12 may be reduced to cause the solder surface 15 to drop away from the board.

When the board 16 has several components to be soldered, the board may be re-positioned to solder the other component leads, additional nozzles may be provided, and/or a larger nozzle may be provided to accommodate leads from more than one component. With closely spaced leads, there is a tendency for excess solder to remain on the board, bridging the leads, as illustrated by leads 27 which are shown as having been soldered already with solder fillets 29. This is very undesirable.

In another type of apparatus, the nozzle 6 may be raised towards the board or component being soldered as described in EP-A-212 911. Also, instead of a constant flow of solder through the nozzle, the nozzle may be in the form of a pot which raised through the surface of the solder in the bath as described in EP-A-481 710.

As mentioned above, U.S. Pat. No. 5,611,480 describes a way of overcoming the problem of solder bridging by rotating the board as it leaves the solder surface. However, in some situations it is not possible to rotate the board in this fashion. For example, there may be components mounted on the underside of the board, which would interfere with the nozzle, or the board may be mounted deep in a housing.

Figure 2:
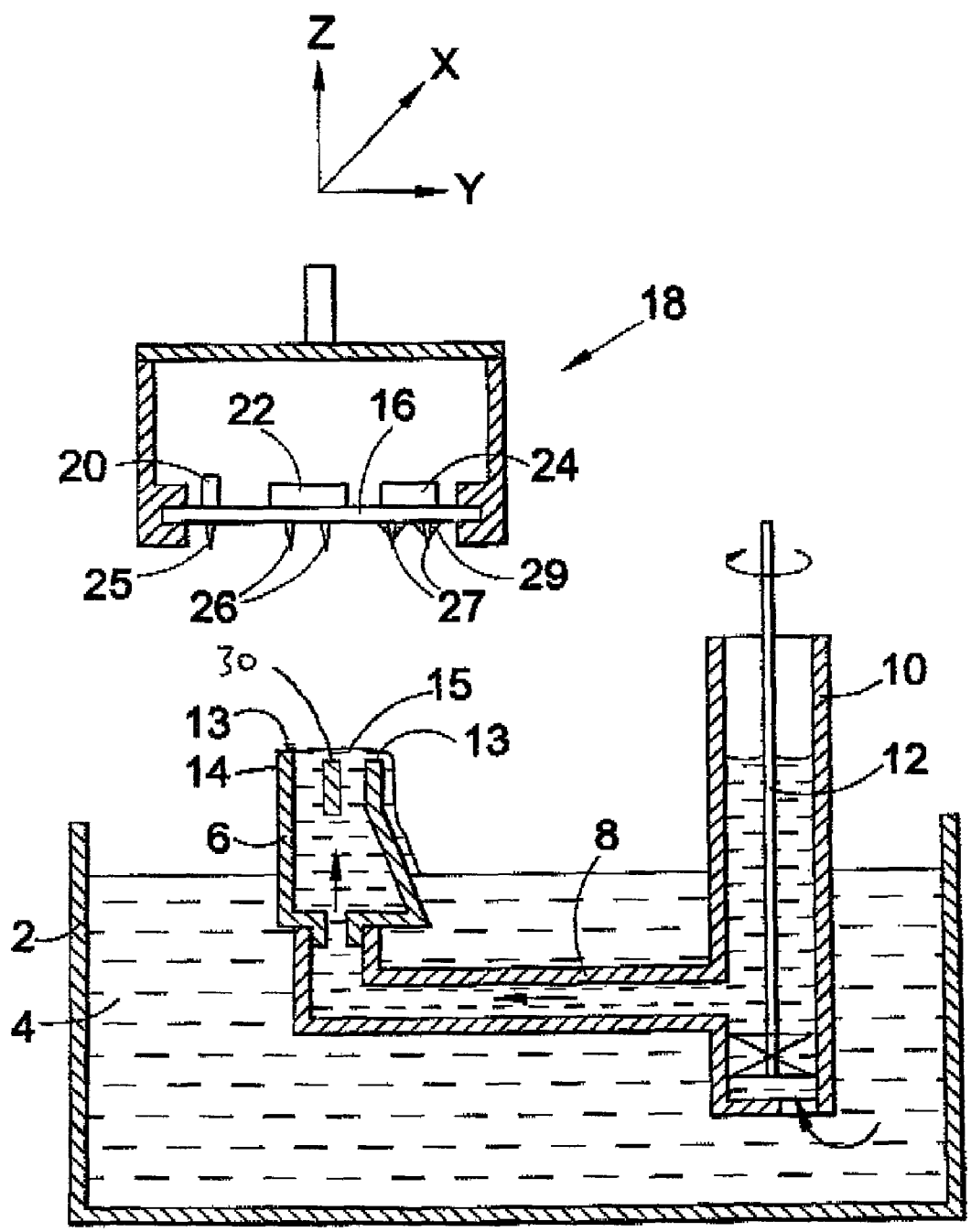
FIG. 2 illustrates an embodiment of the invention.

FIG. 2 shows an embodiment of the present invention, which is a modification of the apparatus of FIG. 1. Like parts have been given like reference numerals.

In FIG. 2, a plate 30 is positioned in the nozzle outlet 14. Plate 30 is of a material which is wetted by the solder 4, for example of iron. When board 16 is lowered towards the nozzle 6, the leads 26 pass either side of the plate 30. It is believed that the plate 30 functions to draw more solder away from the underside 28 of the board. Plate 30 is particularly effective if, before the leads 26 are withdrawn, or withdrawn completely, from the solder surface 15, the surface 16 is lowered to below the upper edge 32 of the plate 30, as will be described in more detail with reference to FIG. 3.

Referring to FIGS. 3a to 3d, the upper edge 32 of plate 30 is at the same level as the upper edge 34 of the nozzle 6, defining the nozzle outlet 14.

Figure 3A:
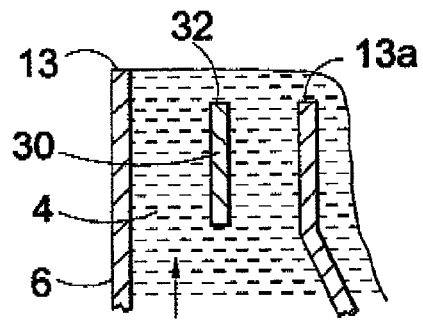
FIGS. 3a to 3d illustrate the operation of the embodiment of FIG. 2.
Figure 3B:
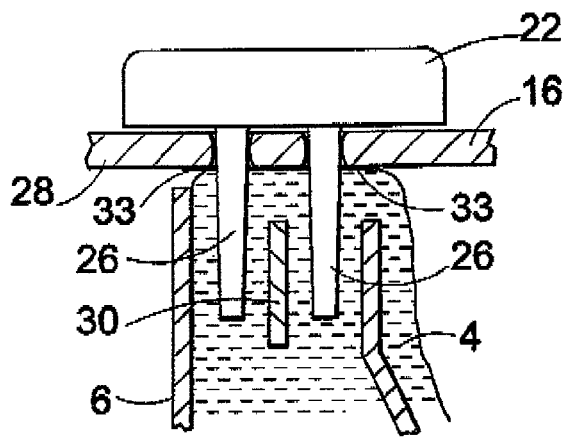
Figure 3C:
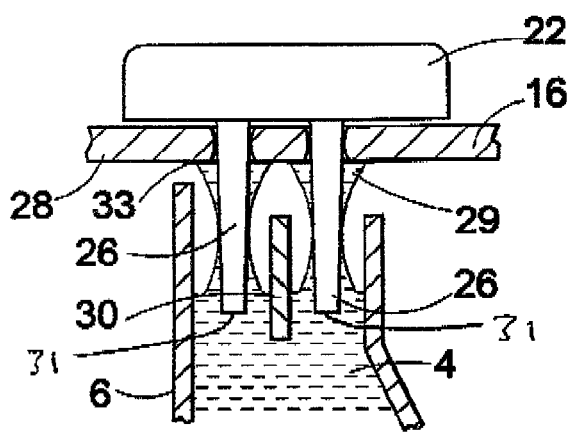
Figure 3D:
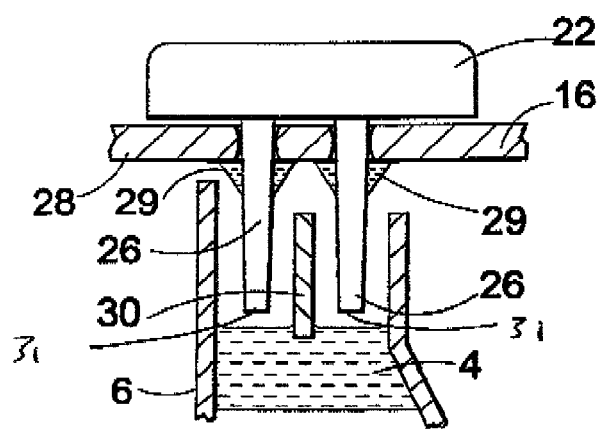

It is preferable that the solder 4 cover the plate 30 during the initial dipping operation, i.e. when the solder is flowing, as illustrated in FIG. 3a. Where one part 13a of the edge 13 is cut away, to give a preferred direction of flow for the overflowing solder, the plate upper edge 32 may be level with the cut away portion. In FIG. 3b, the board 16 has been lowered so that the underside 28 of the board 16 just touches the solder surface 15, although it may be stopped just short of this. Solder 4 will flow up the leads 26 to touch the tracks 33 on the underside 28 of the board 16. In FIGS. 3c and 3d, the speed of impeller 6 has been lowered, to drop the solder surface 15 to below the ends 31 of the leads 26. As the solder surface 15 falls, excess solder is drawn away from the leads 26. By having a wetted surface in the vicinity of the tags 26, provided by plate 30, it is possible to ensure that excess solders not held between the tags 26, which would cause solder bridging. The plate 30 is positioned so that it extends below the ends of the leads, to be interacting with the solder surface 15 as the solder leaves the ends 31 of the leads.

By adjusting the speed at which the solder surface 15 is lowered, or the board raised, the amount of solder retained by the leads 26 can be adjusted.

It will be appreciated that the board 16 may be raised to withdraw the leads 26 from the solder surface 15, as well as lowering the surface 15. However, it is thought to be necessary for the plate 30 to project through the surface 15 at the time the leads 26 clear the surface 15.

As mentioned above, the shape and size of nozzle outlet 14 will be tailored to suit the array of leads which are to be soldered. Similar the plate(s) 30 may be tailored to suit the array of leads.

Figure 4A:
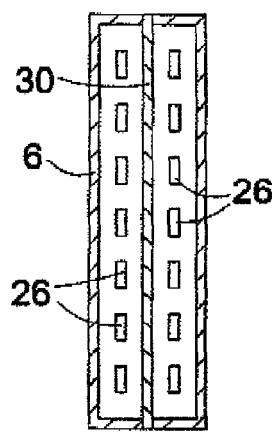

Referring to FIG. 4a, this shows two rows of leads and a plate 30 extending between them.

Figure 4B:
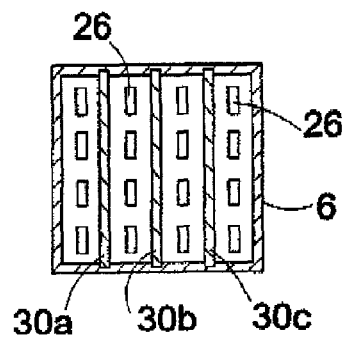

In FIG. 4b, there are four rows of leads, and three plates 30a, 30b, 30c. However, it will be appreciated that the centre plate 30b might not be necessary. This will depend in part on the spacing between the rows of leads, a narrower spacing giving a higher likelihood of solder bridging.

Figure 4C:
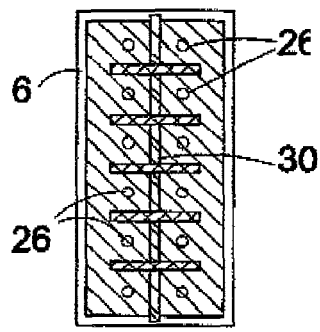

In FIG. 4c, a honeycomb structure is shown.

Figure 5:
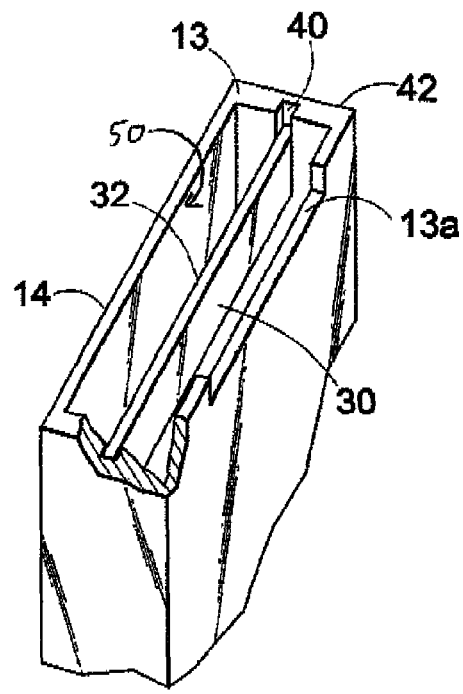
FIG. 5 shows a perspective view of a nozzle outlet of the embodiment of FIG. 2.

FIG. 5 shows a perspective view of the nozzle outlet 14, with plate 30 supported in rebates 40 in the nozzle side walls 42.

Figure 6:
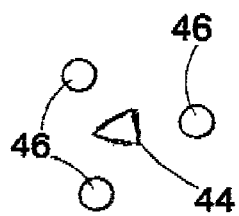
FIG. 6 shows another modification of the embodiment of FIG. 2.

Although an elongate plate provides an effective arrangement for most situations, and is readily mounted in the nozzle outlet, other wetted members are possible. Thus a simple pin shape 44 might be used to fit within an array of three leads 46, as illustrated in FIG. 6.

Also, as mentioned above, the wetted plate 30 may be replaced or supplemented by a wetted surface 50 at the nozzle outlet 14. This may be particularly suitable when soldering a single row of closely spaced leads, as illustrated in FIG. 6.

Although the wetted member has been shown as extending along the length of a row of leads, it could be provided only at or near the end of a row, for example, in order to target those areas where solder bridging is most prone to occur. Also, while vertical movement of the circuit board is shown, the system may also be used when the board is rotated.

Figure 7:
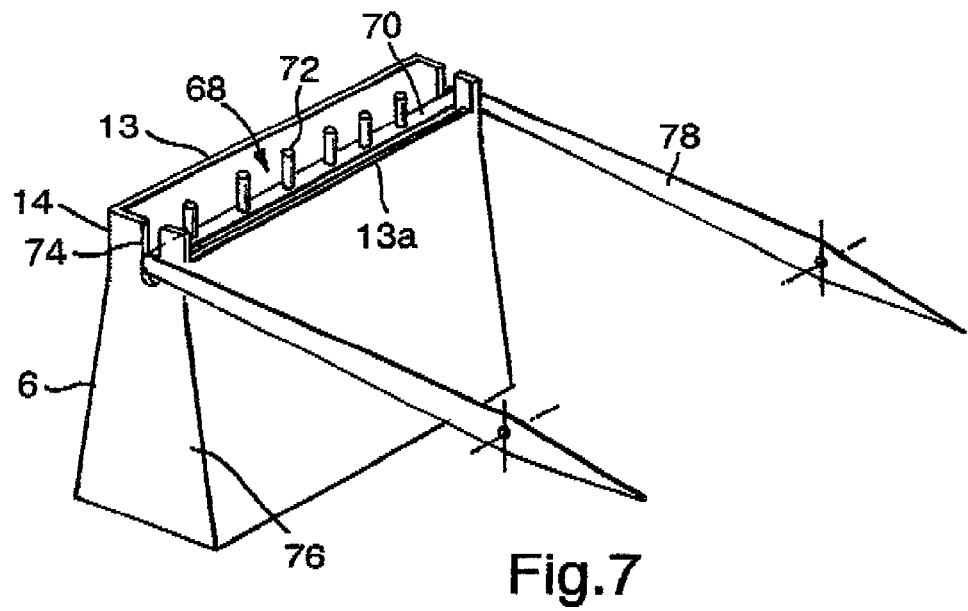
FIG. 7 shows schematically a perspective view of part of a second embodiment of the invention.

FIG. 7 shows a second embodiment in which the wetted member is movable so as to rise through the solder surface 15 as the board 16 is lifted.

Figure 8:
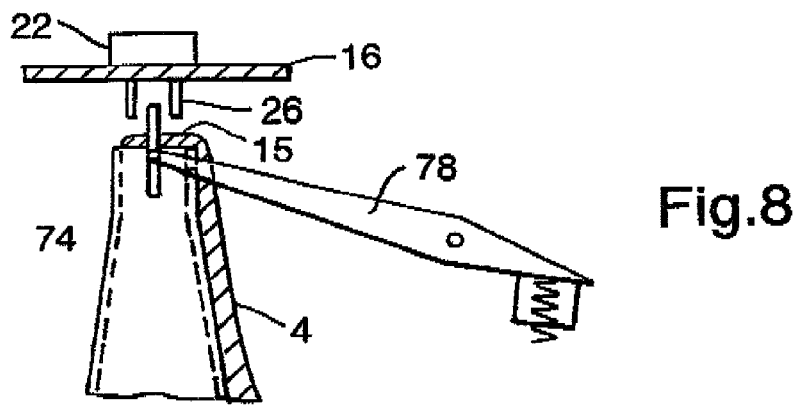
FIG. 8 shows a side view on FIG. 7.

The wetted member 68 is in the form of a rod 70 carrying pins 72 which, in use, extend up between leads 26 on the circuit board (see FIG. 8). The rod 70 slides in slots 74 in sidewalls 76 of the nozzle 6 and is carried on pivot arms 78. Arms 78 may be biased or electrically controlled to raise and lower the wetted member 68.

Figure 9:
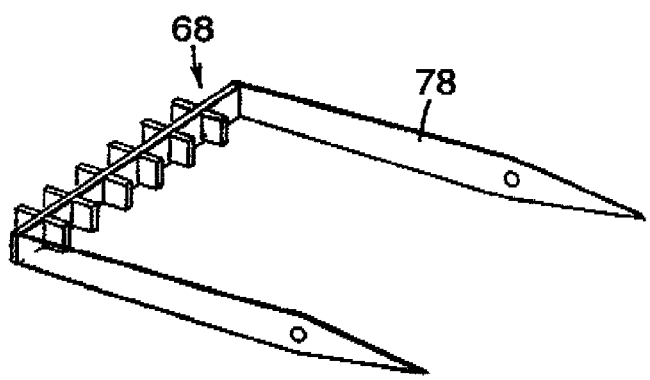
FIG. 9 shows a modification.

As the circuit board 16 is lowered onto the solder surface 15 it will push the pins 72 downwards or they will be driven downwards. As board 16 is raised, and leads 26 start to leave the solder surface 15, the pins 72 will also move upward and through the solder surface, until leads 26 are clear. Thus, the pins 72 will serve to duct excess solder from the leads 26 back to the surface 15. Referring to FIG. 9, the wetted member 68 has a shape similar to member 30 of FIG. 4c.

The invention claimed is:

1. Dip soldering apparatus applying solder to component leads extending downwardly from a printed circuit board, said apparatus comprising:
    a reservoir for molten solder;
    an assembly including an elongate plate provided in the reservoir and movable relative to a surface of the molten solder by means of spring-biased arms which support and move said plate; and
    a holder supporting said printed circuit board, said holder and said reservoir defining one of a first and a second condition, wherein, said first condition said printed circuit board is positioned away from said reservoir and in said second condition said printed circuit board is positioned above said reservoir with said component leads extending at least partially into said molten solder;
    wherein said plate has an upwardly facing edge and side surfaces extending downwards from the plate edge, the plate being positioned and dimensioned in said second condition to fit between adjacent component leads so that said adjacent component are disposed on each side of the plate edge respectively and the plate surfaces being of a material which is wetted by the molten solder.

2. Dip soldering apparatus applying solder to the leads of an electronic component, said apparatus comprising:
    a nozzle having an outlet through which solder is flowed in use; and a component holder supporting said component, said holder being movable between a raised condition in which said component is remote from said nozzle and a lowered condition in which leads to be soldered are dipped into the solder surface at the nozzle outlet;

wherein a member provided at the nozzle outlet and has a surface which is wetted by the solder, the surface being positioned so as to be straddled by two adjacent leads;

wherein the member is movable relative to the solder surface and the nozzle such that it rises upwardly so as to project through the solder surface as said component holder is moved toward said raised condition and as the leads are withdrawn from the solder.

3. The apparatus of claim 2, wherein the member has a honeycomb structure.

4. Dip soldering apparatus comprising a holder supporting a component with leads, a nozzle having an outlet through which solder is flowed in use, leads of the component to be soldered being dipped into the solder surface at the nozzle outlet, wherein the nozzle includes a nozzle member assembly provided at the nozzle outlet, said nozzle member assembly having a surface which is wetted by the solder, the surface being positioned so as to be straddled by two adjacent leads and wherein the nozzle member assembly includes arms, said arms are spring biased or are electrically controlled so as to support and move said member assembly relative to the surface of the solder;

said apparatus further including means for lowering the solder surface in order to effect withdrawal of the leads from the solder.

5. The apparatus of claim 4, wherein said nozzle assembly member is disposed below the level of the solder surface as the solder flows through the nozzle outlet.

6. The apparatus of claim 4, wherein said nozzle member assembly is positioned for projecting through the solder surface as the leads are withdrawn from the solder.

7. Dip soldering apparatus comprising:

a holder supporting a component with leads to be soldered;

a reservoir for molten solder;

a member assembly including an elongate plate provided in the reservoir and positioned at a surface of the molten solder, the plate having an upwardly facing edge and side surfaces extending downwards from the plate edge, the plate being positioned and dimensioned so that adjacent component leads to be soldered pass to each side of the plate edge and the plate surface being of a material which is wetted by the molten solder; and means for lowering the solder surface away from said holder for effecting withdrawal of the component leads from the solder;

wherein said plate is electrically controlled such that it is movable relative to the solder surface.

* * * * *